May 5, 1964 F. W. WEBER 3,132,261
DELAY CIRCUIT EMPLOYING FEEDBACK TO HOLD NORMALLY-OPEN SWITCH CLOSED, ALLOWING CAPACITOR TO FULLY DISCHARGE
Filed Aug. 28, 1961
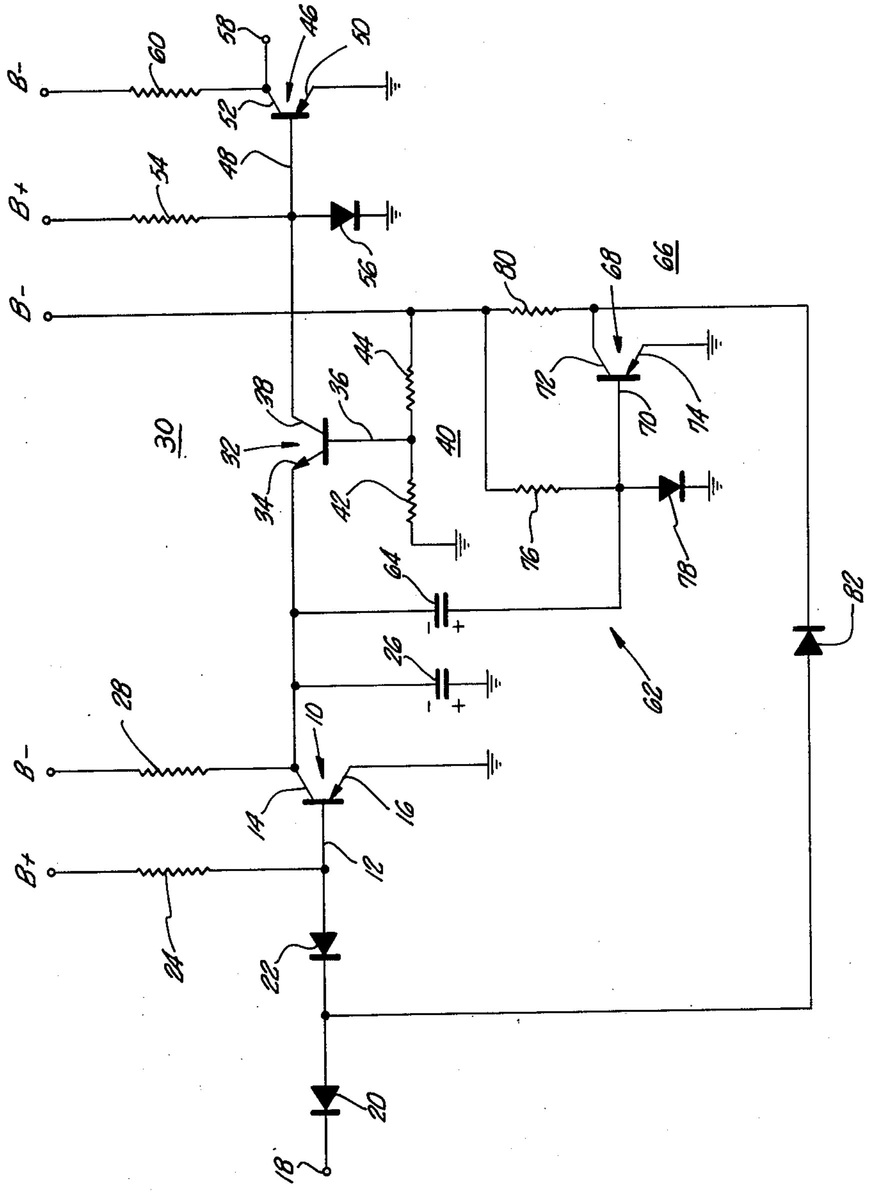
INVENTOR.
FRANK W. WEBER
BY
Christie, Parker & Hale
ATTORNEYS.

United States Patent Office 3,132,261
Patented May 5, 1964

3,132,261

DELAY CIRCUIT EMPLOYING FEEDBACK TO HOLD NORMALLY-OPEN SWITCH CLOSED, ALLOWING CAPACITOR TO FULLY DISCHARGE

Frank W. Weber, Duarte, Calif., assignor to Burroughs Corporation, Detroit, Mich., a corporation of Michigan Filed Aug. 28, 1961, Ser. No. 134,220
7 Claims. (Cl. 307—88.5)

The present invention is directed to improvements in delay circuits employing capacitor timing.

In many electronic systems it is desired to delay a pulse signal for a predetermined time interval. To accomplish this electronic delay circuits are provided. Electronic delay circuits generally include a normally open input switch, the operation of which is controlled by input signals applied thereto. Coupled to the input switch is a normally closed output switch. Coupled between a junction of the input switch and the output switch and a source of biasing poential is a timing capacitor. The timing capacitor is normally charged through a biasing resistor.

To produce a delayed pulse signal, an input pulse is applied to the input switch. In response to the input pulse the input switch is closed and the output switch is opened. When the output switch is opened an output signal developed by the output switch changes from its normal magnitude to a new predetermined magnitude. With the input switch closed and the output switch open the timing capacitor discharges. The timing capacitor continues to discharge to a completely discharged state so long as an input signal is applied to the input switch to maintain the input switch closed. When the input signal terminates, opening the input switch, the capacitor recharges. When the capacitor is fully charged, the output switch is again closed causing the output signal developed by the output switch to return to its normal magnitude. Thus, in response to an input signal applied to the delay circuit, an output signal is developed, the magnitude of which first reduces to a predetermined magnitude for a period of time determined by the delay network and returns to its normal magnitude only after a period of time which is determined by the timing of the delay network.

Delay circuits, in addition to being utilized to provide accurately delayed pulse signals, are also useful in other capacities. For example, a delay circuit may be utilized as a "holdover circuit" to provide means for checking the operation of various processes in a computer system. When so utilized, the delay circuit is coupled to the circuitry associated with the process which it is to monitor and periodically receives pulses generated by the process circuitry. The pulses generated by the process circuitry provide an indication that the process circuitry is functioning properly. A failure in the operation of the process is represented by a failure to generate a pulse signal. In response to a signal received from the process circuitry the input switch of the delay circuit is closed and the output switch is opened to produce an output signal having a predetermined magnitude.

In operating as a holdover circuit it is the function of the delay circuit to maintain the output signal at the predetermined magnitude as long as the process circuitry is functioning properly. To accomplish this the periodicity of the pulse signals generated by the process circuitry is timed with the full time delay of the delay circuit such that if the process circuitry is functioning properly a pulse signal is received by the input switch of the delay network just prior to the closing of the output switch, thereby maintaining the output signal at the predetermined magnitude. If the process which is being monitored should fail, no pulse signal is generated by the process circuitry and the output switch is closed, causing a change in the magnitude of the output signal, the change in magnitude of the output signal indicating a failure in the process.

Since the periodicity of the pulse signal generated by the process circuitry is timed to the full delay time of the delay circuit, it is necessary that the timing capacitor of the delay circuit be allowed to completely discharge during each cycle of operation. If the timing capacitor is not allowed to fully discharge, the output switch may close before a pulse signal is received by the delay network, thereby giving a false indication of a process failure.

Since the timing capacitor proceeds to complete discharge only so long as the input switch of the delay network is closed and the input switch is closed while an input pulse is applied thereto, it is necessary that the pulse signals generated by the process circuitry have a predetermined time duration. That is, the pulse signals must have a time duration sufficient to maintain the input switch closed for a period of time required for the timing capacitor to fully discharge.

Thus, although the delay circuit provides satisfactory means for monitoring process circuitry, its operation is limited in that the pulse signals applied to the delay circuit must be of a sufficient time duration to completely discharge the timing capacitor. If the pulse signals applied to the prior art delay circuit are of insufficient time duration to allow the timing capacitor to completely discharge upon the termination of the input signal, the timing capacitor may be able to completely recharge and close the output switch thereby modifying the magnitude of the output signal to falsely indicate a failure in the process being monitored. This is particularly a problem in electronic computers wherein the pulses generated by the process circuitry are of an extremely short time duration. Under such conditions the prior art type of delay network such as described above does not provide satisfactory means for monitoring the operation of the process circuitry.

In view of the above, the present invention provides a delay network employing capacitor timing which includes means for assuring that its timing capacitor is completely discharged in response to any input signal applied to the delay network irrespective of the time duration of the input signal.

To accomplish this the delay network of the present invention includes, in combination with the prior art type of delay network, a feedback arrangement for maintaining the activation of the delay network for a predetermined time interval after an input signal applied to the delay network has terminated.

As briefly described above, the prior art type of delay network includes a normally open input switch, a normally closed output switch, a timing capacitor coupled between a junction of the input switch and the output switch and a source of biasing potential, and a biasing resistor coupled between the junction of the input switch and output switch and a second source of biasing portion. The feedback network of the present invention is coupled between the junction of the input switch and the output switch and the input terminal of the input switch. Basically, the feedback network includes a second timing capacitor coupled to the junction of the input switch and the output switch and a control switch coupled between the second timing capacitor and the input terminal of the input switch. Preferably, the control switch comprises a transistor. The transistor is normally biased to a conducting state whereby the second timing capacitor is normally charged from the transistor through to the biasing resistor. Regenerative feedback means are included between the transistor and the input terminal to complete the feedback network.

When an input signal of a short time duration is applied to the input terminal of the delay network of the present invention, the input switch is momentarily closed, and the output switch and control switch are opened. With the control switch open, a potential is applied from the control switch to the input terminal of the input switch which maintains the input switch closed so long as the control switch is open. Thus, the input switch remains closed after the input signal applied to the input terminal has terminated. With the input switch closed, the first and second timing capacitors are free to fully discharge. When the timing capacitors are fully discharged the control switch is again closed, opening the input switch. The timing capacitors then begin to recharge and will completely recharge if an input signal is not received from the process circuitry.

Accordingly, by timing the periodicity of the pulse signals generated by the process circuitry with the operation of the delay circuit of the present invention, an output signal is developed by the delay circuit having a predetermined magnitude which is maintained in response to input signals of a time duration substantially shorter than heretofore possible.

The above, as well as other features of the present invention, may be more clearly understood by reference to the following detailed description when considered with the drawing, the single figure of which is a schematic representation of a preferred embodiment of the present invention.

As represented, the delay network includes a PNP type transistor 10 having a base terminal 12, a collector terminal 14 and an emitter terminal 16. The transistor 10 is arranged in a grounded emitter configuration whereby the base terminal 12 acts as an input for the transistor 10. The base terminal 12 is connected to an input terminal 18 through a pair of series connected diodes 20 and 22 and to a source of potential represented as B+, through a biasing resistor 24. Due to the source of potential B+, the base terminal 12 is normally maintained silghtly positive relative to the emitter terminal 16. Thus, the transistor 10 is normally nonconducting.

The operation of the transistor 10 is controlled by pulse signals applied to the input terminal 18. In particular, a negative input signal applied to the input terminal 18 causes the transistor 10 to become conducting. Thus, the transistor 10, in response to input signals applied to the input terminal 18, operates as a normally open input switch for the delay circuit.

To provide the accurately timed delay for the delay circuit, a timing capacitor 26 is coupled between the collector terminal 14 of the transistor 10 and ground. The timing capacitor 26 is normally charged from ground through a biasing resistor 28 to a source of biasing potential represented as B—.

To provide means for developing an output signal having a predetermined magnitude, the delay circuit includes a normally closed output switch represented generally at 30. The output switch 30 includes an NPN type transistor 32 having an emitter terminal 34, a base terminal 36, and a collector terminal 38. The emitter terminal 34 is coupled to the junction of the capacitor 26 and the biasing resistor 28 while the base terminal 36 is coupled to a voltage divider represented generally at 40.

The voltage divider 40 includes a pair of series connected resistors 42 and 44. The resistor 42 is coupled to ground and the resistor 44 is coupled to the source of biasing potential B—. Due to the voltage divider arrangement 40, a potential is maintained at the base terminal 36 of the transistor 32 which is positive relative to the source of biasing potential B—, the potential at the base terminal 36 having a magnitude which is less than B—. Accordingly, the transistor 32 is normally conducting through the biasing resistor 28 to limit the charge on the capacitor 26, thereby defining when the capacitor 26 is fully charged. Thus, for example, if the potential at the base terminal 36 is maintained at —6 volts and the potential across the emitter-base junction of the transistor

32 when fully conductive is 0.1 volt, the potential at the junction of the capacitor 26 and the biasing resistor 28 is clamped at —6.1 volts, thereby limiting the voltage on the capacitor 26 to 6.1 volts to define the capacitor as fully charged.

Coupled to the collector 38 of the transistor 32 is a PNP type output transistor 46. The transistor 46 includes a base terminal 48, an emitter terminal 50 and a collector terminal 52. The transistor 46 is arranged in grounded emitter configuration. The the base terminal 48 is coupled to the collector terminal 38 of the transistor 32, to the source of biasing potential B+ through a biasing resistor 54, and to ground through a diode 56. Due to the source of biasing potential B+, the base terminal 48 is normally slightly positive relative to the emitter terminal 50. Accordingly, the transistor 46 is normally nonconducting. However, when the transistor 32 is conducting, the potential at the collector terminal 38 is clamped at a negative value relative to ground. Thus, when the transistor 32 is conducting, the base terminal 48 is negative relative to the emitter terminal 50 and the transistor 46 is conducting. Accordingly, the transistor 46 is conducting when the transistor 32 is conducting and is nonconducting when the trasistr 32 is nonconducting. When the transistor 46 is nonconducting, an output signal is developed at an output terminal 58 which is coupled to the collector terminal 52. The output signals have a magnitude determined by the magnitude of the source of biasing potential B— which is also coupled to the collector terminal 52 through a biasing resistor 60.

To insure that the timing capacitor 26 is fully discharged in response to input signals of short time duration applied to the input terminal 18, the delay circuit of the present invention includes a feedback circuit indicated generally at 62. The feedback circuit 62 is coupled between a junction of the transistors 32 and 10 and a junction of the diodes 20 and 22. The feedback network 62 functions to maintain the transistor 10 in a conducting state after the input signal applied to the input terminal 18 has terminated. To accomplish this the feedback network 62 includes a timing capacitor 64 coupled to a junction of the timing capacitor 26 and the biasing resistor 28 and a control switch indicated generally at 66, coupled between the capacitor 64 and the base terminal 12 of the transistor 10.

Preferably, the control switch 66 includes a PNP type transistor 68 having a base terminal 70, a collector terminal 72 and an emitter terminal 74. The transistor 66 is arranged in a grounded emitter configuration with the base terminal 70 coupled to the capacitor 64. The base terminal 70 is also coupled to the source of biasing potential B— through a biasing resistor 76 and to ground through a diode 78. Due to the source of biasing potential B—, the base terminal 70 is normally maintained slightly negative relative to the emitter terminal 74. Thus, the transistor 68 is normally conducting and charges the timing capacitor 64 through the biasing resistor 28 to a voltage level determined by the transistor 32.

The collector terminal 72 of the transistor 68 is also coupled to the source of biasing potential B— through a biasing resistor 80 and to a junction of the diodes 20 and 22 through a diode 82. The connection between the collector 72 and the junction of the diodes 20 and 22 through the diode 82 provides a regenerative feedback path between the transistor 68 and the transistor 10 which operates as hereinafter described to maintain the transistor 10 in a conducting state after the input signal applied to the input terminal 18 has terminated, thereby assuring the complete discharge of the timing capacitor 26.

In view of the above, the delay network, in its normal state, includes a normally nonconducting transistor 10, normally conducting transistors 32, 46 and 68 and fully charged capacitors 26 and 64. To initiate an output signal at the output terminal 58 having a predetermined magnitude, a negative input signal is applied at the input terminal 18. The negative input signal causes the base terminal 12 to become negative relative to the emitter terminal 16 and the transistor 10 to become conducting. With the transistor 10 conducting, the potential at the collector terminal 14 tends to rise toward ground potential. The increase in potential at the collector 14 causes the potential at the emitter terminal 34 of the transistor 32 to become positive relative to the base terminal 36. Thus, the transistor 32 cuts off causing the output transistor 46 to likewise become nonconductive, initiating the output signal having a predetermined magnitude at the output terminal 58.

The increase in potential at the collector terminal 14 of the transistor 10 is also reflected across the timing capacitor 64 to the base terminal 70 of the transistor 68, causing the base terminal 70 to rise to a positive potential limited by the forward breakdown voltage of the diode 78. With the base terminal 70 positive relative to the emitter terminal 74, the transistor 68 is cut off. With the transistor 68 nonconducting, the potential at the collector terminal 72 becomes more negative. The change in potential at the collector terminal 72 is reflected by the regenerative feed-back path to the base terminal 12 of the transistor 10, maintaining the base terminal 12 negative relative to the emitter terminal 16 and causing the transistor 10 to remain conductive after the termination of the input signal. Due to the regenerative feedback path between the transistor 68 and the transistor 10, the transistor 10 remains conducting so long as the transistor 68 is nonconducting. The transistor 68 remains nonconducting for a period of time determined by the discharge time of the timing capacitors 26 and 64.

In particular, with the transistor 10 conducting and the transistors 32, 46 and 68 nonconducting, the capacitors 26 and 64 discharge. The capacitor 26 discharges through the transistor 10 while the capacitor 64 discharges through the diode 78. The capacitor 26 discharges until the potential at the junction of the capacitor 26 and the resistor 28 is clamped by the collector terminal 14. Since the collector voltage of the transistor, when conducting, is generally on the order of 0.3 volt, the junction of the capacitor 26 and the resistor 28 is clamped at substantially $-0.3$ volt, defining a fully discharged condition for the capacitor 26.

With the capacitor 26 fully discharged, the timing capacitor 64 continues to discharge for a short time. When the capacitor 26 is fully discharged, the potential at the junction of the capacitor 64 and the biasing resistor 28 is substantially $-0.3$ volt, while the potential at the junction of the capacitor 64 and the base terminal 70, with the transistor 68 nonconducting, is clamped at substantially 0.4 volt by the cut-off voltage of the diode 78. Thus, the capacitor 64 continues to discharge through the biasing resistor 76 until the voltage at the base terminal 70 becomes slightly negative relative to the potential at the emitter terminal 74. At this time the transistor 68 again becomes conductive.

The conduction of the transistor 68 causes the potential at the collector terminal 72 to become more positive. The change in potential at the collector terminal 72 is reflected through the regenerative feedback path to the base terminal 12 of the transistor 10, causing the transistor 10 to become nonconducting.

With the transistor 10 nonconducting and the transistor 68 conducting, the capacitors 64 and 26 charge through the biasing resistor 28. The capacitors 64 and 26 continue to charge until the potential across the emitter terminal 34 of the transistor 32 becomes negative relative to the base terminal 36. The transistor 32 then becomes conducting, clamping the voltage at the junction of the capacitors 26 and 64 and the resistor 28 to define the capacitors 26 and 64 as fully charged. With the transistor 32 conducting, the output transistor 46 also becomes conducting terminating the output signal of predetermined magnitude.

Thus, in response to an input signal having a very short time duration, an output signal is developed having a predetermined magnitude and is maintained after the input signal has terminated for a period of time determined by the time required for the timing capacitor 26 to fully charge from its completely discharged state. Accordingly, the delay network of the present invention may be employed in a setting wherein input signals of extremely short time duration are applied to and timed with the operation of the delay circuit to maintain an output signal having a predetermined magnitude as a check on the proper functioning of the circuitry initiating the timed input signals.

What is claimed is:

1. A delay circuit comprising: a normally open input switch having an input terminal, the input switch being closed in response to an input signal applied to the input terminal; a normally closed output switch coupled to the input switch; means for opening the output switch in response to a closing of the input switch; a first capacitor coupled to a junction of the input switch and the output switch; a biasing resistor coupled to the junction of the input switch and the output switch; means for charging the first capacitor through the biasing resistor; and feedback means coupled between the junction of the input switch and the output switch and the input terminal for maintaining the input switch closed for a period of time after the input signal applied to the input switch has terminated including a second capacitor coupled to a junction of the first capacitor and the biasing resistor, a control switch coupled between the second capacitor and the input terminal, the control switch being normally closed to charge the second capacitor through the biasing resistor, and means for opening the control switch in response to a closing of the input switch for a period of time required for the first capacitor and the second capacitor to discharge.

2. In a delay circuit comprising a normally open input switch having an input terminal, the input switch being closed by an input signal applied to the input terminal, a normally closed output switch coupled to the input switch, the output switch being opened in response to a closing of the input switch, a first timing capacitor coupled to a junction of the input switch and the output switch and means for charging the first capacitor through a biasing resistor coupled to the junction of the input and the output switches, a feedback means coupled between the junction of the input switch and the output switch and the input terminal for maintaining the input switch closed for a period of time after the input signal applied to the input switch has terminated including a second timing capacitor coupled to the junction of the input switch and the output switch, a control switch coupled between the second timing capacitor and the input terminal, the control switch being normally closed to charge the second timing capacitor through the biasing resistor, and means for opening the control switch in response to a closing of the input switch for a period of time required for the first timing capacitor and the second timing capacitor to discharge.

3. In a delay circuit comprising a normally open input switch having an input terminal, the input switch being opened by an input signal applied to the input terminal, a normally closed output switch coupled to the input switch, the output switch being opened in response to a closing of the input switch, a first timing capacitor coupled to a junction of the input switch and the output switch and means for charging the first capacitor through a biasing resistor coupled to the junction of the input switch and the output switch, a feedback means coupled between the junction of the input switch and the output switch and the input terminal for maintaining the input switch closed for a period of time after the input signal applied to the input switch has terminated including: a second timing capacitor coupled to the junction of the input switch and the output switch; a transistor coupled to the second timing capacitor; means for biasing the transistor to be normally conducting to normally charge the second timing capacitor through the biasing resistor and nonconducting in response to a closing of the input switch for a period of time required for the first and second timing capacitors to discharge; and regenerative feedback means coupled between the transistor and the input terminal for maintaining the input switch closed while the transistor is nonconducting.

4. A delay circuit comprising: a first transistor; means for biasing the first transistor to be normally nonconducting whereby the operation of the first transistor is controlled by input signals applied thereto; a second transistor coupled between the first transistor and an output terminal; means for biasing the second transistor to be normally conducting; a first timing capacitor coupled to a junction of the first transistor and the second transistor; a biasing resistor coupled to the junction of the first transistor and the second transistor; means for charging the first capacitor through the biasing resistor; a second timing capacitor coupled to the junction of the first transistor and the second transistor; a third transistor coupled to the second timing capacitor; means for biasing the third transistor to be normally conducting whereby the second timing capacitor is normally charged from the third transistor through the biasing resistor; and regenerative feedback means coupled between the third transistor and the first transistor.

5. A delay circuit comprising: a first transistor; means for biasing the first transistor to be normally nonconducting, the operation of the first transistor being controlled by input signals applied thereto; a first timing capacitor coupled to the first transistor; a biasing resistor coupled to a junction of the first transistor and the first timing capacitor; means for charging the first capacitor through the biasing resistor; a second transistor coupled to a junction of the first timing capacitor and the biasing resistor; means for biasing the second transistor to be normally conducting whereby the second transistor, when conducting, limits the voltage to which the first timing capacitor may charge; a third transistor coupled between the second transistor and an output terminal; means for biasing the third transistor to be conducting when the second transistor is conducting and nonconducting when the second transistor is nonconducting; a second timing capacitor coupled between the junction of the first timing capacitor and the biasing resistor; a fourth transistor coupled to the second timing capacitor; means for biasing the fourth transistor to be normally conducting whereby the second timing capacitor is normally charged from the fourth transistor through the biasing resistor to a voltage limited by the second transistor; and regenerative feedback means coupled between the fourth transistor and the first transistor.

6. A delay circuit comprising: a capacitor; a biasing resistor coupled to the capacitor; means for charging the capacitor through the biasing resistor; a normally open switch coupled to a junction of the capacitor and the biasing resistor and having an input terminal, the switch being arranged to close and provide a discharge path for the capacitor in response to an input signal applied to the input terminal; feedback means coupled between the junction of the capacitor and the biasing resistor and the input terminal for maintaining the switch closed for a period of time required for the capacitor to fully discharge; and output means coupled to the junction of the capacitor and the biasing resistor.

7. A delay circuit comprising: a first capacitor; a biasing resistor coupled to the first capacitor; means for charging the first capacitor through the biasing resistor; a normally open switch coupled to a junction of the first capacitor and the biasing resistor, the switch having an input terminal and being closed to discharge the capacitor by an input signal applied to the input terminal; a second timing capacitor coupled to a junction of the first timing capacitor and the biasing resistor; a normally closed switch coupled between the second capacitor and the input terminal; means for charging the second capacitor through the biasing resistor when the normally closed switch is closed; means for opening the normally closed switch in response to a closing of the normally open switch to discharge the second capacitor; means responsive to an opening of the normally closed switch for applying a signal to the input terminal to maintain a normally open switch closed; and output means coupled to the junction of the first capacitor and the biasing resistor.

References Cited in the file of this patent

UNITED STATES PATENTS

| | | |
|---|---|---|
| 2,418,425 | Poch | Apr. 1, 1947 |
| 2,627,576 | Howarth | Feb. 3, 1953 |
| 2,845,548 | Sillman et al. | July 29, 1958 |
| 3,035,184 | Walker et al. | May 15, 1962 |